United States Patent [19]

Klaassen

[11] Patent Number: 5,608,591
[45] Date of Patent: Mar. 4, 1997

[54] INTEGRATED HEAD-ELECTRONICS INTERCONNECTION SUSPENSION FOR A DATA RECORDING DISK DRIVE

[75] Inventor: Klaas B. Klaassen, San Jose, Calif.

[73] Assignee: International Business Machines Corporation, Armonk, N.Y.

[21] Appl. No.: 489,310

[22] Filed: Jun. 9, 1995

[51] Int. Cl.$^6$ ............................................. G11B 5/48
[52] U.S. Cl. .................................................. 360/104
[58] Field of Search ................................... 360/104

[56] References Cited

U.S. PATENT DOCUMENTS

| | | | |
|---|---|---|---|
| 3,823,416 | 7/1974 | Warner | 360/122 |
| 4,167,765 | 9/1979 | Watrous | 360/103 |
| 4,761,699 | 8/1988 | Ainslie et al. | 360/103 |
| 4,819,094 | 4/1989 | Oberg | 360/104 |
| 4,996,623 | 2/1991 | Erpelding et al. | 360/104 |
| 5,041,932 | 8/1991 | Hamilton | 360/104 |
| 5,055,969 | 10/1991 | Putnam | 361/398 |
| 5,103,359 | 4/1992 | Marazzo | 360/104 |
| 5,111,351 | 5/1992 | Hamilton | 360/104 |
| 5,490,027 | 2/1996 | Hamilton et al. | 360/104 |
| 5,491,597 | 2/1996 | Bennin | 360/104 |

FOREIGN PATENT DOCUMENTS

| | | |
|---|---|---|
| 0484906A2 | 5/1992 | European Pat. Off. . |
| 53-30310 | 3/1978 | Japan . |
| 53-74414 | 7/1978 | Japan . |

OTHER PUBLICATIONS

J. R. Reidenbach, Combination Suspension–Lead Cable for a Multi–Gap Read/Write Head, IBM Tech. Disclosure Bulletin, vol. 22, No. 4, pp. 1602–1603, Sep. 1979.

Book, Electronics for Modern Scientist, H. Moraff, Chapter 8 Principles of Radio Frequency Electronics & Electromagnetic Radiation, Section 8.5 Transmission Lines, pp. 464–468. Jan. 1983

*Primary Examiner*—John H. Wolff
*Attorney, Agent, or Firm*—Thomas R. Berthold

[57] ABSTRACT

An integrated transducer-electronics interconnection suspension for a disk drive having a high data transfer rate generally above 15 Mbytes/sec between the transducer and the read/write electronics. A suspension supports a slider to which a transducer is mounted and maintains the slider in close proximity to the disk surface. An integrated transducer-electronics interconnection suspension is a laminate structure having electrically conductive traces as part of the structure and connecting the transducer with the read/write electronics. It can support high data transfer rates between the transducer and the read/write electronics by avoiding sudden changes in the characteristic impedance of the traces to minimize signal reflection on them. The width of the traces are shaped accordingly to prevent abrupt changes in the trace impedance caused by trace bonding areas, apertures and other mechanical obstructions in the suspension. Changes in the traces' direction are gradual to avoid signal reflection. Also, a patterned electrically conductive back plane may be provided in the laminate to better control the trace characteristic impedance. Where a trace crosses above a back plane opening, lateral extensions from the trace's side edges are formed to compensate for the resulting impedance change. In addition, the traces and bonding areas are grouped by signal type, with sufficient spacing between the groups, to minimize cross-coupling of the signals.

20 Claims, 7 Drawing Sheets

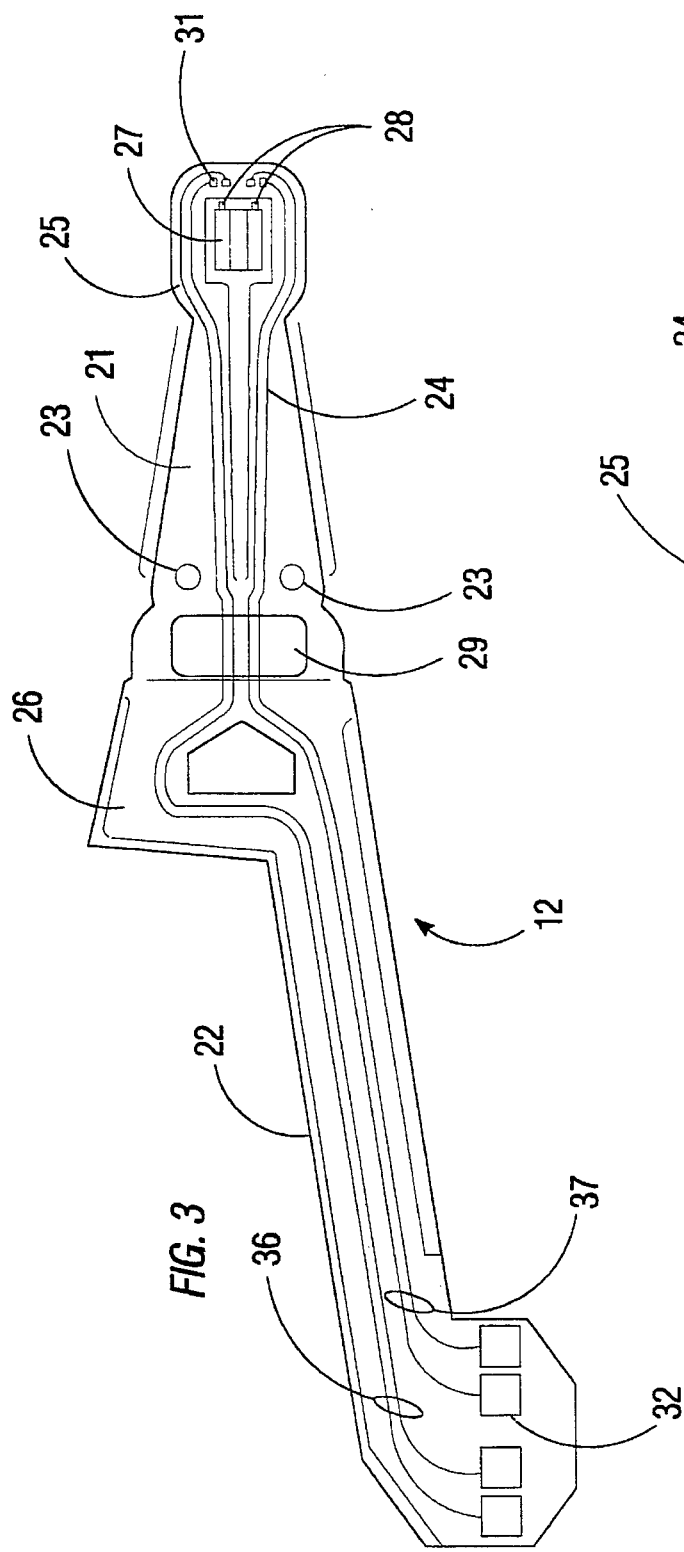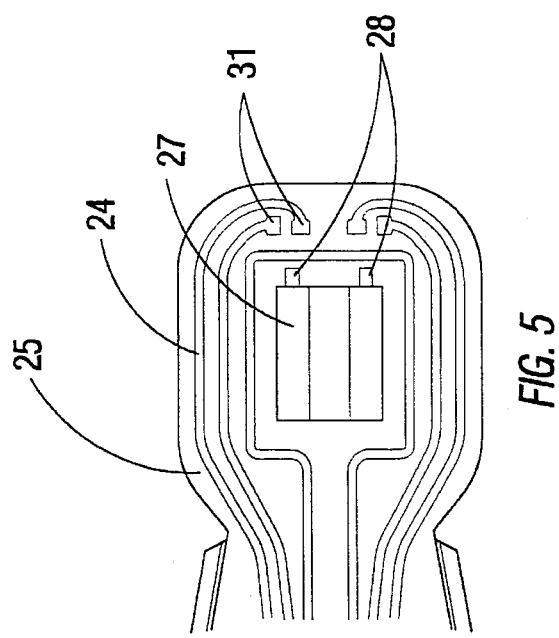

INTEGRATED HEAD-ELECTRONICS INTERCONNECTION SUSPENSION FOR A DATA RECORDING DISK DRIVE

FIELD OF THE INVENTION

This invention relates to a slider-suspension assembly for a data recording disk drive. More particularly, the invention relates to an integrated head-electronics interconnection suspension for use in a disk drive having a high data transfer rate between a transducer and the read/write electronics.

BACKGROUND OF THE INVENTION

Disk drives are information storage devices that utilize at least one rotatable disk with concentric data tracks containing the information, a transducer (or head) for reading data from or writing data to the various tracks, and a transducer positioning actuator connected to the transducer for moving it to the desired track and maintaining it over the track during read and write operations. The transducer is attached to a slider, such as an air-bearing slider, which is supported adjacent to the data surface of the disk by a cushion of air generated by the rotated disk. The transducer can also be attached to a contact-recording type slider. In either case, the slider is connected to a support arm of the transducer-positioning actuator by means of a suspension.

The suspension provides dimensional stability between the slider and the actuator arm, controlled flexibility in pitch and roll motion of the slider relative to its direction of motion on the rotating disk, and resistance to yaw motion. In conventional disk drives having air-bearing sliders, the suspension provides a load or force against the slider which is compensated by the force of the air-bearing between the slider's air-bearing surface and the disk surface. Thus, an air-bearing slider is maintained in extremely close proximity to, but out of contact with, the data surface of the disk. The suspension typically comprises a load beam, which is mounted at one end to the actuator arm, and a flexure element which is attached to the other end of the load beam and whose gimbal area supports the slider. The load beam provides the resilient spring action which biases the slider toward the surface of the disk. This spring action provides flexibility for the slider as the slider rides on the cushion of air between the airbearing surface and the rotating disk. Also, the gimbal provides roll and pitch flexibility needed for the slider to follow the dish surface. Such a suspension is described, for instance, in assignee's U.S. Pat. No. 4,167,765. An example of a conventional slider for use with such a suspension is described in assignee's U.S. Pat. No. 3,823,416.

In a conventional air-bearing slider-suspension assembly, the slider is mechanically attached to the flexure element of the suspension by epoxy bonding. The electrical connection between the transducer and the read/write electronics is made of twisted wires which run the length of the suspension load beam and extend over the flexure element and the slider. The ends of the wires are soldered or ultrasonically bonded to the transducer bonding areas or pads located on the slider. Another type of suspension is a composite or laminated structure comprising a base layer with patterned electrical leads formed thereon and an insulating cover layer, as described in IBM Technical Disclosure Bulletin, Vol. 22, No. 4 (Sep. 1979), pp. 1602–1603 and Japanese Kokai Nos. 53-74414 (Jul. 1, 1978) and 53-30310 (Mar. 22, 1978). In the laminated suspension described in Japanese Kokai No. 53-74414, the slider is epoxy-bonded to the laminated suspension and the transducer bonding areas are soldered to the electrical leads formed on the suspension. Assignee's U.S. Pat. No. 4,761,699 describes a laminated suspension for use with a conventional slider wherein solder ball connections provide both the mechanical connection of the slider to the laminated suspension and the electrical connection of the transducer to the leads on the laminated suspension.

Assignee's U.S. Pat. No. 4,996,623 describes yet another type of laminated suspension for use with a negative pressure slider. For this type of suspension, it is desirable to maintain the slider adjacent to the data surface of the disk with as low a loading force as possible. The suspension is a flat, flexible sheet of material bonded on both sides to patterned metal layers and having hinge regions. Portions of the laminated suspension near the hinge regions are bent such that the suspension supports the slider in a manner to prevent the transducer from contacting the disk surface. Thus, the stiction problem associated with the negative pressure slider and the disk surface is eliminated.

One of the problems with disk drives using the conventional suspension or the laminated type suspension is that the ill-defined characteristic impedance of the electrical conductors prevents reliable, high data-rate transfer between the transducer and the read/write electronics. For instance, in disk drives with a data rate greater than approximately 15 million bytes per second, a large bandwidth is required between the transducer and the read/write electronics for transmitting data at very high frequencies. This requirement is particularly critical in the transmission of nearly rectangular write signals or where the connection distance is large, for instance 5 to 6 cm in a 3.5" disk drive. The characteristic impedance of a twisted conductor depends partially on the wire diameter, the insulation thickness, the number of twists per unit of length, the tightness of the twists, and its proximity to the ground plane. Furthermore, the characteristic impedance of a conductor normally does not remain uniform over the length of the conductor due to changes in its shape, in its spacing from other conductors, or in the area adjacent to the trace. These changes are usually required to accommodate mechanical obstructions in the trace's path. For example, a conductor may be narrowed in some areas or changed in its direction to accommodate openings and corrugations in the suspension, or holes in the suspension used for mechanical alignment. The characteristic impedance of a conductor may also be changed where it is located directly above an aperture required for a hinge in the suspension. Finally, it may be necessary to alter the shape of a conductor to achieve a desired characteristic impedance of the conductor for accommodating a particular type of transducer or read/write electronic design.

The present invention solves the above problem by providing the conductors as electrically conductive traces in the laminated structure of the suspension. The shapes of the traces are varied to avoid abrupt changes in the characteristic impedance of the traces or to obtain a specific impedance value where needed. Another technique for controlling the trace impedance is to provide an electrically conductive back plane in the laminated structure of the integrated head-electronics interconnection suspension. The characteristic impedance of selected portions of the traces can then be adjusted by removing portions of the back plane under the traces.

Another problem with disk drives using the conventional suspension or the laminated type suspension is that the twisted conductors can easily break off during the manufacture of the suspension-slider assembly. This problem arises since the soldering and twisting of the conductors are normally done by a machine in the automated manufacturing of the suspension. The integrated suspension of the present invention eliminates the breakage of the conductors by including them as a part of the suspension's laminated structure. It thus facilitates the manufacture of the suspension and lowers its manufacturing cost by improving the yield.

SUMMARY OF THE INVENTION

The invention is a data recording disk drive having an integrated transducer-electronics interconnection suspension to support high data transfer rates, for example rates greater than approximately 15 million bytes per second, between the transducer and the read/write electronics. The integrated suspension is a laminated structure having a base or substrate layer and a first electrically conductive layer formed on the base layer. The suspension has a gimbal area to which a slider is attached. At least one transducer is attached to the slider for reading data from and writing data to a disk surface. The first electrically conductive layer is etched to form a plurality of electrically conductive traces interconnecting the transducer and a read/write electronics module. Each trace has a bonding area at each of its ends for electrical connection to the transducer and the electronics module, respectively. The electrical traces are preferably copper or gold plated copper and may be protected with an optional electrically insulating cover layer, for instance, polyimide. The base layer is preferably made of alumina. In another embodiment of the invention, the base layer is a second electrically conductive layer and an electrically insulating layer between the first and the second electrically conductive layers. The second conductive layer may be made of stainless steel while the second insulating layer may be polyimide.

In a preferred embodiment of the present invention, the shapes of the electrical traces are varied in some areas to compensate for sudden changes in the characteristic impedance of the traces. The characteristic impedance for a section of a trace depends on, among other factors, the dimensions of the trace section, its proximity to adjacent traces, and the material surrounding the trace. In a typical suspension, sudden changes in a trace's characteristic impedance are usually due to variations in the trace width to accommodate mechanical obstructions in the path of the trace, larger width of the bonding areas, or in areas where the trace changes its direction. Thus, an object of the present invention is to make the changes in the trace's characteristic impedance as gradual as possible to prevent signal reflection along the trace. Where the width of the trace must be narrowed in an area, for instance to accommodate a hinge or an alignment hole in the suspension, the change in the trace width must be gradual to avoid creating hard signal reflection points in the trace. The gradual change in the trace width results in a gradual change in the trace capacitance and inductance and thus in the trace characteristic impedance. As a result, any signal reflection along the trace caused by the narrowed portion is avoided. Such a reflection-free interconnection between a transducer and the read/write electronics is critical in a high data-rate disk drive. The same technique for controlling the trace characteristic impedance applies where the trace terminates with a bonding area having a width larger than the width of the trace. The sudden increase in the trace width as it becomes the bonding area would cause a reflection of electrical signals transmitted along the trace. This reflection, however, can be minimized by gradually increasing the width of the trace near the bonding area to achieve a smooth transition in the trace characteristic impedance in the region near the bonding area. Similarly, a sudden change in the direction of the trace also acts as a signal reflection point. The reflection problem can be avoided or significantly reduced by keeping the width of the trace constant across the turn and by selecting the radius of the inside trace edge, i.e., the inner radius, to be the same or greater than the width of the trace.

In another embodiment of the present invention, the laminate structure of the suspension further has an electrically conductive back plane, preferably copper, located between the base layer and the electrical traces. There is also an electrically insulating layer, preferably polyimide, between the back plane and the electrical traces. The back plane provides additional means for controlling the characteristic impedance of the trace so that the reflection of electrical signals can be minimized. In the case where an electrical trace is located above an aperture in the back plane, for example, where an aperture is required for a suspension hinge, the aperture effectively lowers the characteristic capacitance of the trace and in turn increases the characteristic impedance of that portion of the trace. The resulting signal reflection may be minimized by locating or shaping the aperture or by routing the trace across it so that the peripheral portions of the aperture directly below the trace are at a shallow non-perpendicular angle with the longitudinal axis of the trace. Alternatively, the sudden drop in the trace capacitance in the region above the aperture can also be compensated for by widening the width of the trace in the area directly above the aperture. In yet another embodiment, one or more lateral extensions from the side edges of the trace may be created on each side of the aperture to locally compensate for the capacitance reduction caused by the aperture in the back plane. Thus, the characteristic impedance of the trace is maintained generally constant in the region above the aperture and any reflection of signals along the trace caused by the aperture is minimized.

Similarly, the back plane provides an additional means for minimizing signal reflection along a trace which has a wider bonding area. In this case, the back plane is partially removed under the bonding area. The partially removed back plane effectively lowers the capacitance of the bonding area and therefore compensates for the additional capacitance due to the area's larger width. As a result, the characteristic impedance of the trace does not change abruptly as the trace width becomes wider at the bonding area. Any signal reflection along the trace due to the bonding area is thus minimized.

Another object of the present invention is to avoid reflection points at the ends of a trace where the trace is connected to a transducer or an electronics module. Using one or more of the above techniques, the shape of the trace and the pattern of the back plane, if one is provided, are chosen so that the characteristic impedance of the trace region near the electronics module is substantially equal to the output impedance of the electronics module. Thus, an abrupt change in the trace characteristic impedance is avoided at the connection to the electronics module and any reflection of signals there is minimized. Similarly, the characteristic impedance of the trace region near its transducer end is made substantially equal to the output impedance of the transducer to minimize any signal reflection at that end. Furthermore, where the characteristic impedance of the trace region near one of its ends is different from that at the other end, and the width of the trace's end regions are different, the trace width is gradually tapered between the two end regions to provide a gradual change in the trace characteristic impedance. Thus, any reflection of signals due to the impedance difference between the trace end regions is minimized.

In a preferred embodiment of the integrated suspension, the required high transmission bandwidth for the electrical traces is further achieved by minimizing any cross coupling between the read and write signals. Where the suspension supports more than one transducer, the read traces of the transducers are grouped together as closely as possible. Their write traces are grouped similarly. In addition, the spacing between the read traces and the write traces of the transducers is made as large as the width of the suspension can accommodate to reduce the cross coupling between them. Likewise, the bonding areas for the read traces and the write traces are respectively grouped and spaced for even further reduction of the cross coupling between the read and write signals.

BRIEF DESCRIPTION OF THE DRAWINGS

FIG. 3 illustrates a plan view of an integrated head-electronics interconnection suspension of the present invention having electrical traces, bonding areas, and transducers or read/write heads mounted on a slider. The slider is attached to the gimbal area of the suspension.

FIG. 4 is an enlarged view of a bonding area depicted in FIG. 3.

FIG. 5 illustrates an enlarged view of the gimbal area depicted in FIG. 3 showing the slider, transducers, traces, and bonding areas in further detail.

DETAILED DESCRIPTION

Prior Art

Figure 1:
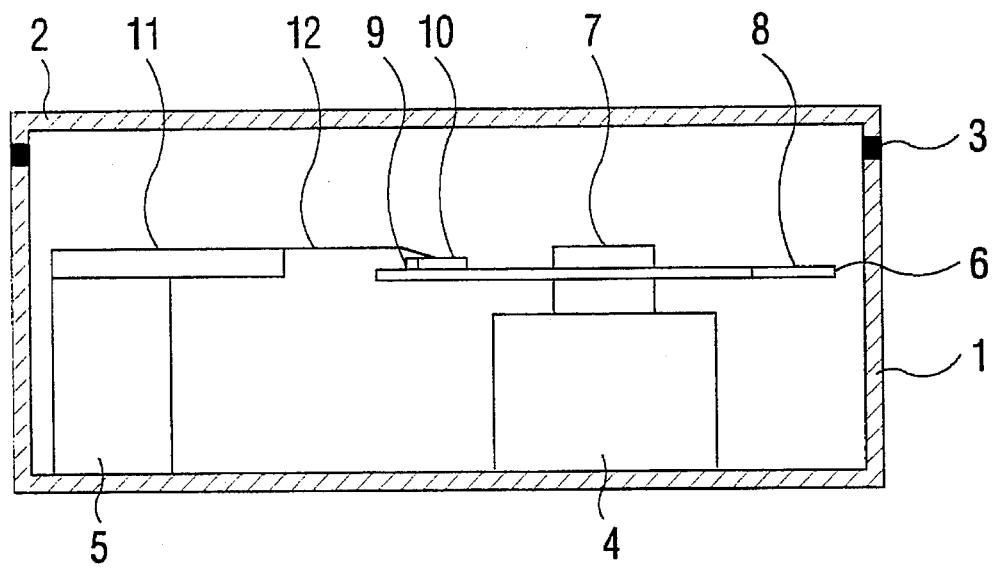
FIG. 1 is a simplified block diagram of a prior art magnetic recording disk drive for use with the integrated head-electronics interconnection suspension according to the present invention.

Although the integrated head-electronics interconnection suspension of the present invention will be described as embodied in a magnetic disk storage system, as shown in FIG. 1, the invention is also applicable to other magnetic recording systems, such as a magnetic tape recording system, and to magnetic random access memory systems wherein a magnetoresistive element serves as a bit cell.

Referring to FIG. 1, there is illustrated in sectional view a schematic of a prior art disk drive of the type using an integrated head-electronics interconnection suspension. The disk drive comprises a base 1 to which are secured a disk drive motor 4 and an actuator 5, and a cover 2. The base 1 and cover 2 provide a substantially sealed housing for the disk drive. Typically, there is a gasket 3 located between base 1 and cover 2 and a small breather port (not shown) for equalizing pressure between the interior of the disk drive and the outside environment. A magnetic recording disk 6 is connected to drive motor 4 by means of hub 7 to which it is attached for rotation by the drive motor 4. Magnetic recording disk 6 has a data surface 8 for data to be written to and read from. A read/write head or transducer 9 is formed on the trailing end of a carrier, such as a slider 10. Slider 10 may be of an air-bearing type or a contact recording type. Transducer 9 may be an inductive read and write transducer or an inductive write transducer with a magnetoresistive (MR) read transducer. The slider 10 is connected to the actuator 5 by means of a rigid support arm 11 and a flexible suspension 12. The suspension 12 provides a biasing force which urges the slider 10 onto the data surface 8 of the recording disk 6. During operation of the disk drive, the drive motor 4 rotates the disk 6 at a constant speed, and the actuator 5, which is typically a linear or rotary voice coil motor (VCM), moves the slider 10 generally radially across the data surface 8 so that the read/write head may access different data tracks on disk 6.

Figure 2:
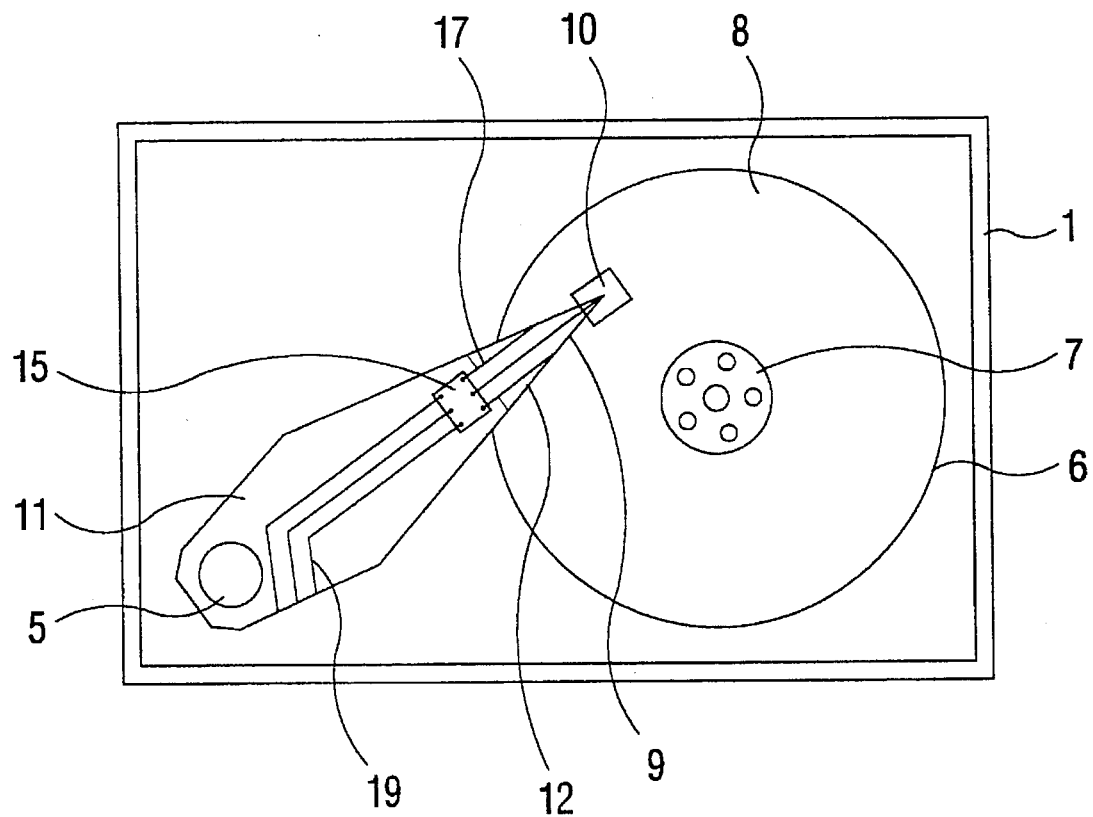
FIG. 2 is a top view of the disk drive of FIG. 1 with the cover removed.

FIG. 2 is a top view of the interior of the disk drive with the cover 2 removed, and illustrates in better detail the suspension 12 which provides a force to the slider 10 to urge it toward the disk 6. The suspension may be a conventional type of suspension such as the well-known Watrous suspension, as described in assignee's U.S. Pat. No. 4,167,765. This type of suspension also provides a gimbaled attachment of the slider which allows the slider to pitch and roll as it rides on the air bearing. The data detected from disk 6 by the transducer 9 is processed into a data read-back signal by signal amplification and processing circuitry in an electronics module 15 located on arm 11. This module can also be placed on the side of the arm. The signals from transducer 9 travel via electrical conductors 17 to the electronics module 15, which sends and receives its signals via electrical conductor 19. In the conventional embodiment shown in FIG. 2, the electrical conductors 17 between the transducer 9 and the electronics module 15 are made of twisted wires, each having an electrically insulating cover. Typically, the insulated conductors 17 are soldered or ultrasonically bonded at their first ends to the electrical bonding areas (not shown) of the transducer 9. The conductors are then twisted and soldered at their second ends to the leads of electronics module 15. An alternate implementation for the suspension may be a laminated type such as the one described in assignee's U.S. Pat. No. 4,996,623. In this type of suspension, both conductors 17 and conductors 19 may be formed from an electrically conductive layer that is a part of the suspension's laminate structure. The assignee's U.S. Pat. No. 4,996,623, however, does not disclose any means for providing wide frequency bandwidth interconnection conductors in the laminate structure.

The above description of a typical magnetic disk storage system, and the accompanying FIGS. 1 and 2, are for representation purposes only. It should be apparent that disk storage systems may contain a large number of disks and actuators, each actuator may support a number of sliders, and each slider may have more than one transducer. In addition, a typical disk storage system may have multiple laminated suspensions, each including one or more of the embodiments of the present invention.

Preferred Embodiment

Referring to FIG. 3, the integrated head-electronics interconnection suspension of the present invention is an integral unit 12 comprising a suspension portion 21 and a tail portion 22. The suspension portion 21 has a gimbal area 25 at one end to which slider 27 is attached and a mounting base 26 at the other end for attachment to a rigid support arm of an actuator (not illustrated). The suspension portion 21 further includes an aperture 29 near the mounting base 26. Aperture 29 may be required to form a hinge which provides flexure to the suspension. The tail portion 22 extends from the mounting base 26 toward the actuator (not shown). The transducers or read/write heads 28 are attached to the slider 27 for reading data from and writing data to the data surface 8 of recording disk 6. A plurality of electrically conductive traces 24 are formed on the integrated head-electronics interconnection suspension connecting the transducers 28 with an electronics module (not illustrated) located near the actuator end of the integrated head-electronics interconnection suspension. The electrically conductive traces 24 run almost the entire length of the suspension portion 21 and the tail portion 22. Each of the electrical traces 24 has a bonding area 31 at one end for connection to a transducer 28 and a bonding area 32 at the other end for connection to the electronics module. The bonding areas 31, 32 have a generally larger width than that of the traces 24 to facilitate wire or package pin connection to the bonding areas. FIG. 4 illustrates an enlarged view of a bonding area 31 or 32 and a portion of a trace 24. Although the gimbal area 25 is illustrated in FIG. 5 with one slider 27 attached, it may have more than one slider. Two transducers 28, each capable of reading data from and writing data to the disk, are attached to the slider 27. Although two read/write transducers 28 and one slider 27 are shown in the illustrated embodiment, a different combination of sliders, transducers, and types of transducers may also be used. The transducers 28 are electrically connected to the bonding areas 31 located in the gimbal area 25.

Figure 6A:
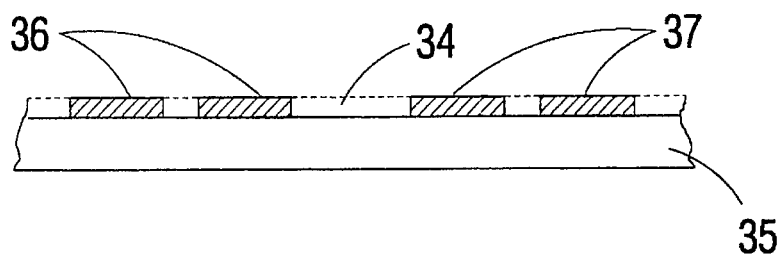
FIG. 6A is a sectional view of an integrated head-electronics interconnection suspension having a base layer and electrically conductive traces.
Figure 6B:
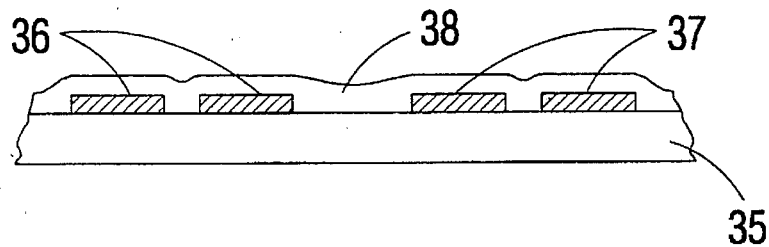
FIG. 6B is a sectional view of the integrated head-electronics interconnection suspension depicted in FIG. 6A having an additional insulating layer formed above the electrical traces.

The integrated head-electronics interconnection suspension is a laminate structure having a base layer and a first electrically conductive layer patterned to form a plurality of electrically conductive traces on the base layer. FIG. 6A illustrates a sectional view of a suspension of the present invention having electrical traces 36 and 37 formed on the base layer 35. The base layer 35 is made of an elastic and electrically nonconductive material, such as alumina, from which the integrated head-electronics interconnection suspension is fabricated. The electrically conductive layer 34 is preferably made of copper or gold-cladded copper, and for instance by a deposition process, on the base layer 35. The electrically conductive layer 34 is then etched to form electrically conductive traces 36, 37. FIG. 6B illustrates a sectional view of the integrated head-electronics interconnection suspension depicted in FIG. 6A, having an additional electrically insulating layer 38 deposited on the traces 36, 37. The insulating layer 38 may be a layer of polyurethane or of a dielectric material such as alumina formed over the electrical traces for protecting the traces from damage, corrosion, or for providing the laminate structure with enhanced stiffness.

Figure 7A:
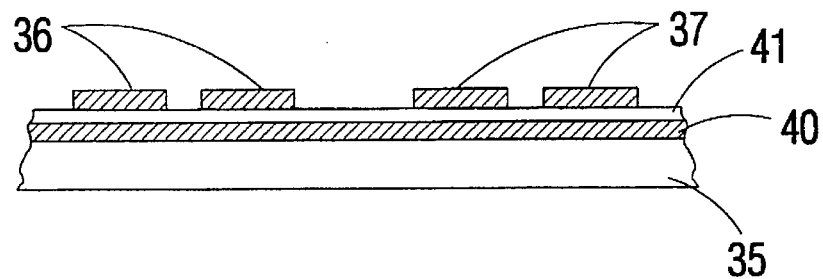
FIG. 7A is a sectional view of the integrated head-electronics interconnection suspension with an additional electrically conductive back plane between the electrical traces and the base layer, and an additional electrically insulating layer between the electrical traces and the back plane.
Figure 7B:
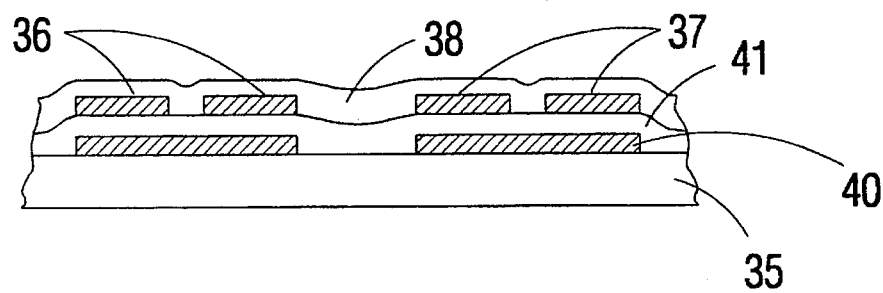
FIG. 7B is a sectional view of the integrated head-electronics interconnection suspension depicted in FIG. 7A having an additional insulating layer on the electrical traces and a patterned back plane.

FIG. 7A shows another preferred embodiment for the laminate structure of the integrated head-electronics interconnection suspension. In this embodiment, the laminate structure comprises a second electrically conductive layer 40 and a second electrically insulating layer 41. The electrically conductive layer 40 is preferably made of copper and may be formed on the base 35 by any commonly known lamination or deposition process. The electrically insulating layer 41 is preferably a dielectric material such as alumina, silicon nitride, or polyimide to provide electrical insulation between the electrical traces 36, 37 and the second electrically conductive layer 40. The second electrically conductive layer 40 forms a back plane which may be patterned to allow better control of the characteristic impedance of the traces 36, 37. FIG. 7B provides a sectional view of the integrated suspension depicted in FIG. 7A with a patterned back plane 40 and an additional electrically insulating cover layer 38 above traces 36, 37. Similar to the laminate structure depicted in FIG. 6B, the additional insulating cover layer 38 is added to protect the traces 36, 37 from damage, corrosion, or to provide the laminate structure with enhanced stiffness.

Figure 8A:
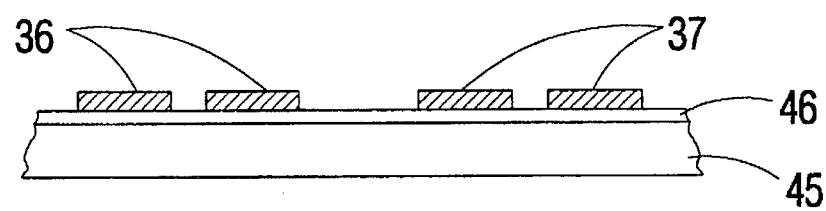
FIG. 8A illustrates an alternate embodiment of the present invention in which the base layer comprises an electrically conductive layer and an insulating layer between the conductive layer and the electrical traces.
Figure 8B:
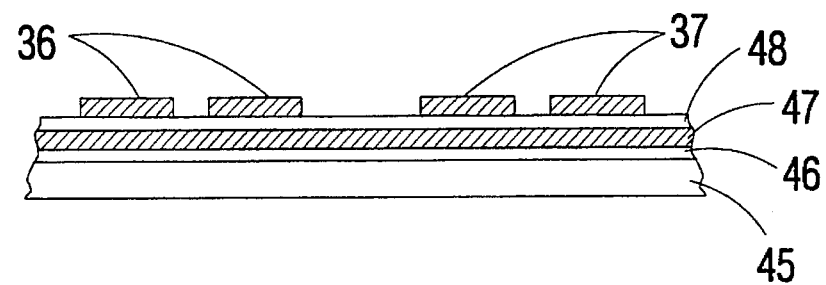
FIG. 8B is a sectional view of the integrated head-electronics interconnection suspension depicted in FIG. 8A having an additional insulating layer and an additional electrically conductive back plane between the electrical traces and the base layer.

FIG. 8A illustrates yet another preferred embodiment for the laminate structure of the integrated head-electronics interconnection suspension of the present invention. In this case, the base layer consists of a second electrically conductive layer 45 and a first electrically insulating layer 46 formed between the conductive layer 45 and electrical traces 36, 37. The electrically conductive layer 45 is preferably stainless steel and the insulating layer 46 may be of a dielectric material such as polyimide. FIG. 8B illustrates yet another preferred embodiment of the integrated head-electronics interconnection suspension. This suspension has the same laminate structure as depicted in FIG. 8A with an additional electrically conductive layer forming a back plane 47 between the first electrically insulating layer 46 and the traces 36, 37. The added back plane 47, preferably copper and may be patterned as in FIG. 7B, provides additional means for controlling the impedance of the electrical traces 36, 37 as does the back plane shown in FIG. 7A. In addition, an electrically insulating layer 48, preferably polyimide, is formed between the electrical traces 36, 37 and the back plane 47 to provide electrical insulation between the traces 36, 37 and the back plane.

As electrical conductors, each of the traces has a characteristic impedance per unit of length which depends on, among other factors, the dimensions of the trace, its closeness to other traces, and the material surrounding the trace. As well known in the field, the characteristic impedance per unit of length of a trace can be calculated by the formula $Z_O = \sqrt{L/C}$, where L and C are the inductance and capacitance per unit of length of the trace, respectively. Both the values of L and C may be measured by conventional inductance and capacitance measuring instruments.

Figure 9:
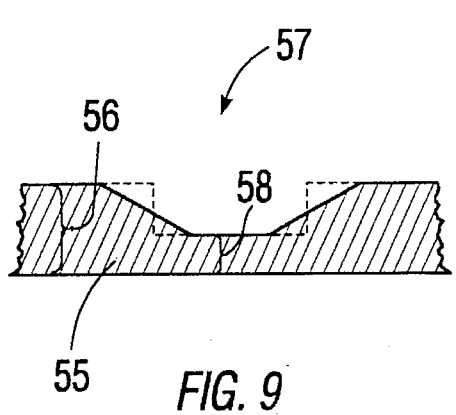
FIGS. 9 and 10 illustrate alternate embodiments for gradually changing the width of an electrical trace near a narrowed portion of the trace.
Figure 10:
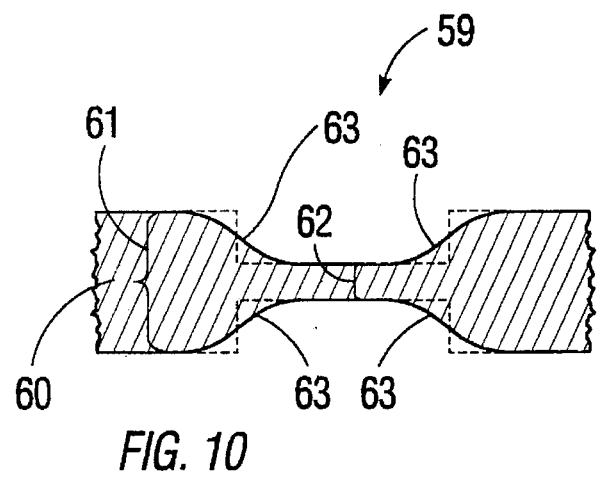

Referring to FIG. 9, there is illustrated a plan view of a narrowed portion 57 in the electrically conductive trace 55. Electrically conductive traces on suspensions of the type similar to the present invention are sometimes narrowed in certain areas of the suspension to avoid mechanical obstructions in their paths, such as the aperture 29. Such a narrowed trace portion results in an abrupt change in the characteristic impedance of the trace 55 which then acts as a reflection point echoing electrical signals transmitted along the trace. In the present invention, signal reflection due to the narrowed portion is minimized by reducing the width of trace 55 gradually from its normal width 56 to the restricted narrow width 58. The gradual change in the trace width results in a gradual decrease in the trace capacitance and a gradual increase in its inductance as it becomes narrowed. Consequently, the characteristic impedance of the trace 55 does not rise sharply at the narrowed portion 57 and the reflection of electrical signals due to the restricted portion is therefore eliminated or at least minimized. FIG. 10 shows an alternate configuration for gradually tapering the width 61 of a trace 60 to become the width 62 of the narrowed portion 59 using curved segments 63.

Figure 11:
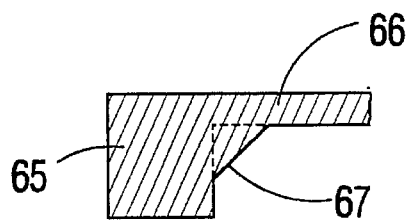
FIGS. 11, 12, and 13 illustrate alternate embodiments for gradually changing the width of an electrical trace near a bonding area.
Figure 13:
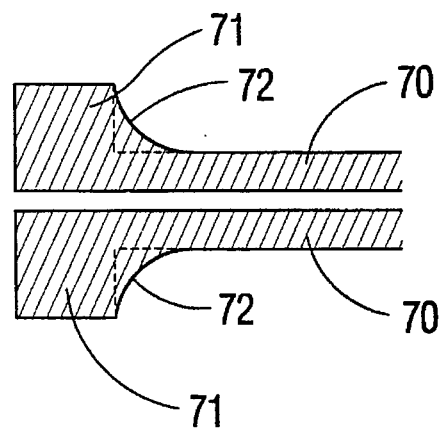
Figure 12:
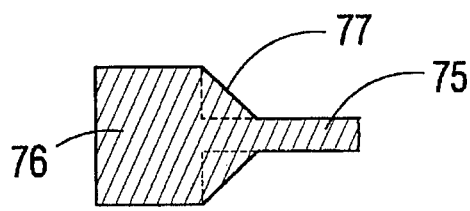

FIG. 11 illustrates an electrically conductive trace 66 terminating into a bonding area 65 for connection to the transducer or the electronics module. Because of the larger width of the bonding area, the area acts as a reflection point for electrical signals transmitted along the trace 66. In the present invention, this signal reflection can be minimized by gradually increasing the width of the trace in the region where it becomes the bonding area 65. The tapered portion 67 causes the characteristic impedance of the trace 66 to change more smoothly as the trace width becomes gradually wider near the bonding area 65. Therefore, any reflection of signals along the trace due to the bonding area can be avoided or minimized. FIG. 12 similarly illustrates a trace 75 with a gradually increasing width. However, in this case the trace 75 joins the bonding area 76 in the middle of a side of the bonding area instead of at one end of the side as shown in FIG. 11. The trace is gradually enlarged on both of its sides so that its width gradually becomes the width of the bonding area. FIG. 13 illustrates a different configuration for gradually increasing the width of a pair of traces 70 near the bonding areas 71 using curved segments 72.

Figures 14, 15:
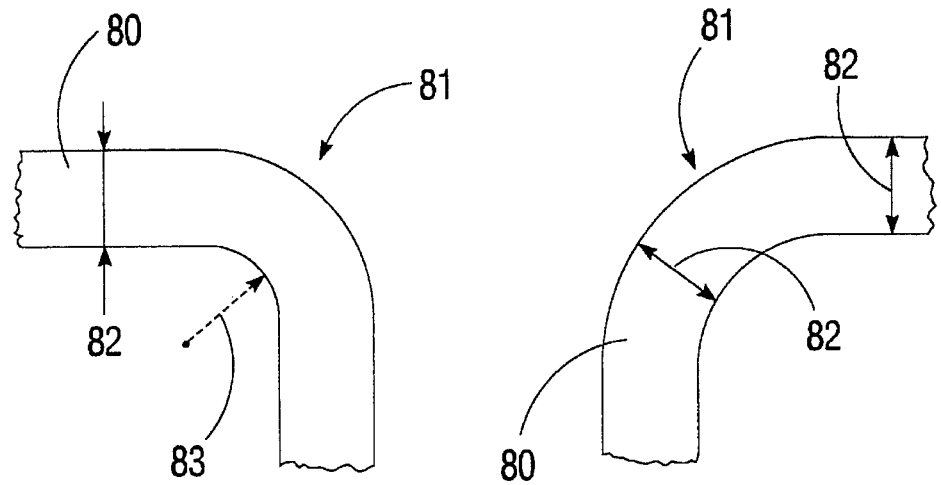
FIGS. 14 and 15 depict the plan views of a trace having a turn in its direction.

FIG. 14 shows a plan view of an electrically conductive trace 80 having a turn 81 within the plane of the first electrically conductive layer. Although only a 90-degree turn is shown here, the embodiment of the present invention applies to turns of all angles. The trace 80 has a width 82 while the turn has an inner radius 83. Like the above shape discontinuities in the trace, any abrupt change in the direction of the trace creates a reflection point for electrical signals transmitted along the trace. Therefore, the turn must be gradual in its change of direction to minimize any reflection of electrical signals along the trace. This result is achieved by selecting the inner radius 83 of the turn 81 as being equal to or greater than the width 82 of trace 80, as illustrated in FIG. 14. In addition, the width 82 of trace 80 must remain generally constant across the turn 81 as shown in FIG. 15.

Figure 16:
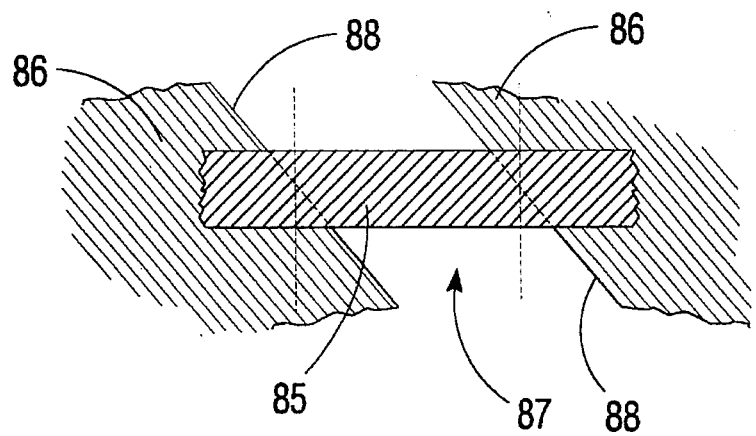
FIGS. 16 and 17 are plan views of the preferred embodiments for locating the peripheral portions of an aperture in the back plane relative to the trace where the trace is located above the aperture.
Figure 17:
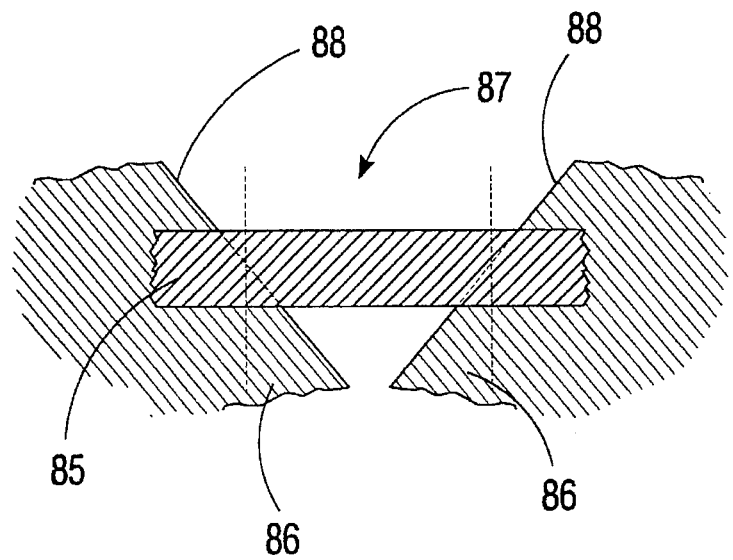

FIG. 16 illustrates an electrically conductive trace 85 crossing above an aperture 87 in the back plane 86. Such an aperture 87 may be necessary, for instance, where an opening is provided in the suspension 12 to form a hinge. The presence of the aperture 87 under the trace 85 causes the characteristic impedance of the trace to rise suddenly as the trace crosses the periphery of the aperture, in turn producing a reflection point for signals traveling along the trace 85. In the present invention, this signal reflection is minimized by locating the aperture 87 relative to the trace 85 so that its peripheral portions 88 are at a non-perpendicular angle relative to the longitudinal axis of the trace 85. As a result, the change in the characteristic impedance of the trace above the aperture is more gradual and any reflection of signals along the trace 85 due to the aperture 87 is minimized. FIG. 17 shows an alternate configuration for locating the peripheral portions 88 of the aperture 87 relative to the trace 85.

Figure 18:
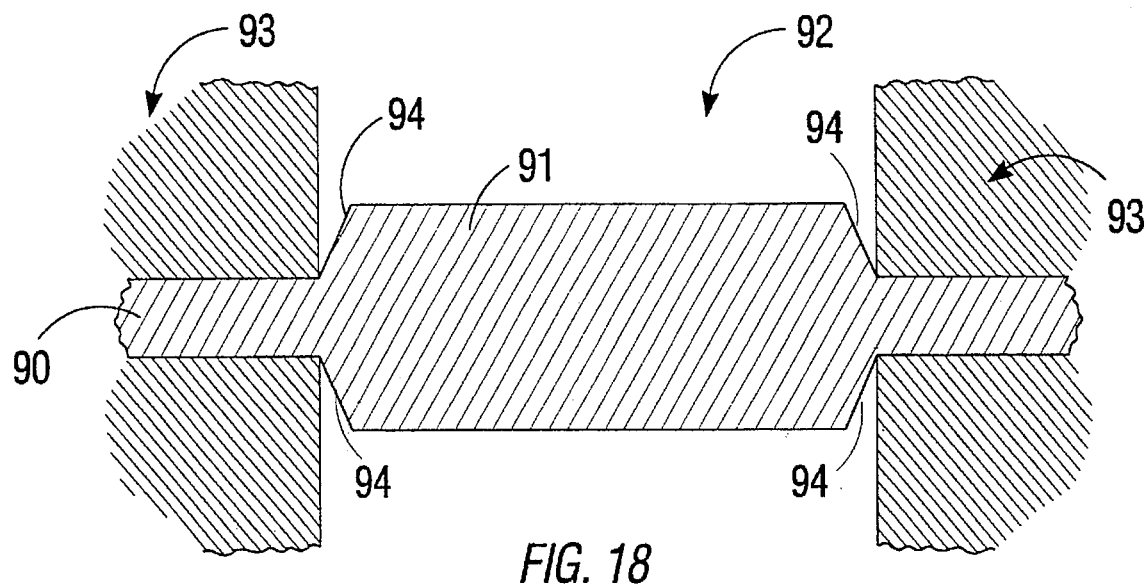
FIG. 18 is a plan view of a widened section of an electrical trace located above an aperture in the back plane.

Another preferred embodiment for minimizing signal reflection along a trace which is located above a back plane aperture is shown in FIG. 18. In this embodiment, the trace 90 is deliberately widened in the region 91 above the aperture 92 of the back plane 93. The widened region 91 of the trace is made as large as necessary so that the added capacitance and the reduced inductance due to the widened region will compensate, respectively, for the loss in the trace capacitance and the gain in the trace inductance caused by the aperture 92. As a result, the characteristic impedance of the trace 90 is maintained generally constant above the aperture 92 and any signal reflection along the trace caused by the aperture is minimized. FIG. 18 further shows gradual changes in the width of the trace 90 by tapered portions 94 to prevent signal reflection points caused by the widened region 91.

Figure 19:
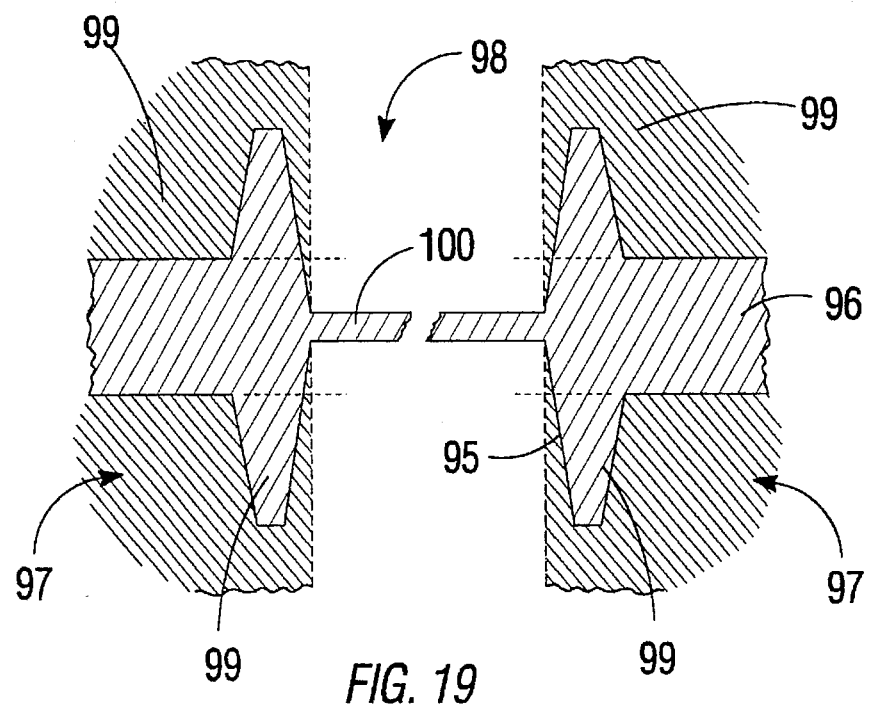
FIG. 19 is a plan view of a preferred embodiment for lateral extensions from the side edges of an electrical trace on both sides of an aperture in the back plane.

FIG. 19 illustrates yet another configuration for compensating a sudden increase in the characteristic impedance of the trace 96 where the trace is located above an aperture 98 in the back plane 97. This configuration is particularly beneficial where the width of the trace 96 must further be reduced in the area above the aperture 98 to avoid a mechanical obstruction in the path of the trace, as shown by the narrowed portion 100. In the present invention, the increased characteristic impedance of the trace caused by the aperture 98 and the narrowed portion 100 may be compensated for by one or more lateral extensions 99 from the trace 96. The lateral extensions 99 are formed on either side edge of the trace 96 and on either side of the aperture 98. The total size of the lateral extensions 99 is chosen such that the added capacitance of the extensions is approximately equal to the capacitance loss caused be the aperture 98 and the narrowed portion 100. Consequently, the characteristic impedance of the trace 96 will remain generally constant in the region above the aperture 98 and any reflection of electrical signals along the trace due to the aperture 98 or the narrowed portion 100 is minimized. The preferred embodiment depicted in FIG. 19 includes a pair of lateral extensions 99 on each side of the aperture 98, with the extensions 99 further having gradually tapered sides 95 for achieving an even more gradual change in the characteristic impedance of the trace.

Figure 20:
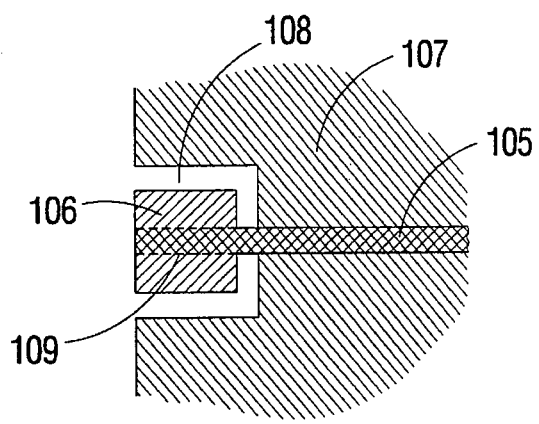
FIG. 20 is a plan view of a bonding area with the back plane partially removed in the region under the bonding pad.
Figure 21:
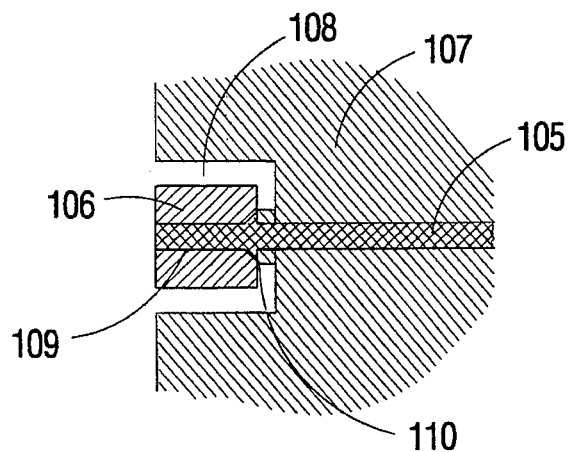
FIG. 21 illustrates a preferred embodiment for the removed back plane depicted in FIG. 20, but where the width of the back plane portion under the trace is changed gradually.

FIG. 20 is a plan view of an electrical trace 105 terminating with a bonding area 106 which is electrically connected to the trace. Both the trace 105 and the bonding area 106 are located above a back plane 107. Like the bonding areas shown in FIGS. 11–13, the larger width of the bonding area 106 creates a reflection of electrical signals along the trace 105. With a back plane, however, this signal reflection may be minimized by partially removing the back plane under the bonding area 106 to create an aperture 108 in the back plane. In addition, a trace-like portion 109 of the back plane directly under the bonding area 106 is left intact to obtain an even more gradual change in the characteristic impedance of the trace 105 near the bonding area 106. The trace-like portion 109 generally has the same width as the width of trace 105 and extends in the direction of the trace. FIG. 21 illustrates the same trace 105 and the bonding area 106 as in FIG. 20, however, the trace-like portion 109 includes a gradually tapered portion 110 to obtain the combined result of a partially removed back plane and a gradual width change for the trace-like portion 109.

Furthermore, in the preferred embodiments of the present invention, the shapes of the traces and the pattern of the back plane, if one is provided, are configured using one or more of the above techniques to obtain a desired characteristic impedance at each end of the traces. In particular, the characteristic impedance of a trace in the region near the electronics module is made substantially equal to output impedance of the electronics module. As a result, any reflection of electrical signals along the trace produced by an abrupt impedance change at the electronics module end of the trace may be avoided or at least minimized. The output impedance of the electronics module can be obtained with a conventional impedance measuring instrument or derived from the circuit design of the electronics module. Similarly, the characteristic impedance of a trace in the region near the transducer is made substantially equal to the output impedance of the transducer to minimize any signal reflection at that end of the trace.

Figure 22:
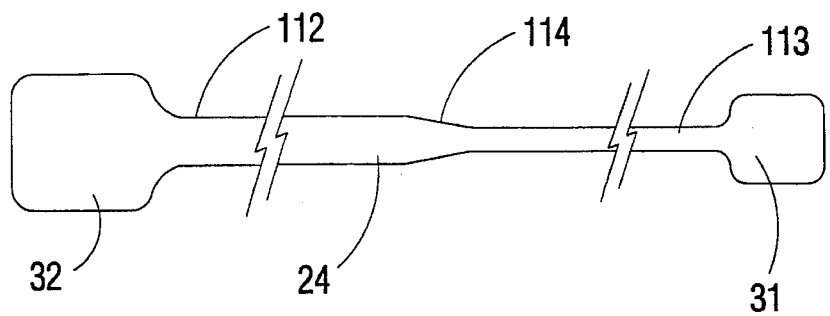
FIG. 22 is a plan view of a trace having bonding areas at its ends for connection to a transducer and an electronics module, where the trace width is gradually tapered between its end regions to avoid an abrupt change in the trace characteristic impedance.

In addition, in case the characteristic impedance in the region near one end of the trace is different from that at the other end, and the width of the trace at its end regions are different, the width of the trace is gradually tapered between its end regions so that an abrupt change in the trace characteristic impedance is avoided. FIG. 22 illustrates a trace 24 having a bonding area 31 for electrical connection to a transducer (not shown) and a bonding area 32 for connection to an electronics module (not shown). The width of the trace portion 112 at one end of the trace is different from the width of the trace portion 113 at the other end of the trace. The width of trace 24 is gradually tapered in region 114 between the trace's end portions to avoid any signal reflection caused by an abrupt change in the trace impedance between the two ends.

Finally, in the preferred embodiments of the present invention, the electrical traces and their associated bonding areas are grouped respectively by the type of the signals they carry to minimize any cross coupling between the signals. FIGS. 3 and 6A illustrate a preferred embodiment of the integrated suspension having such a grouping. In this embodiment, the read traces 36 of the transducers are spaced closely together generally along the entire length of the traces. The write traces 37 of the transducers are similarly spaced closely together. In addition, the read traces 36 are located away from the write traces 37 as far as the width of the suspension can accommodate. Likewise, the bonding areas for the read traces 36 and the write traces 37 are grouped together, respectively, and the read trace bonding areas are spaced away from the write trace bonding areas as far as space on the suspension allows. Such a grouping and spacing of the traces and their respective bonding areas by signal type would minimize any cross coupling between read and write signals traveling along the traces. As a result, an integrated head-electronics interconnection suspension incorporating this and other techniques disclosed in the present invention will be able to support a high data transmission bandwidth, which is critical in a high data-rate disk drive.

While the preferred embodiments of the present invention have been illustrated in detail, it should be apparent that modifications and improvements may be made to the invention without departing from the spirit and scope of the invention as described in the following claims.

What is claimed is:

1. A suspension for a data recording disk drive of the type having a disk with a data surface, a transducer for writing data to and reading data from the disk, the transducer being attached to a slider maintained adjacent to the data surface of the disk, an actuator for moving the slider across the disk, and an electronics module electrically connected to the transducer, the suspension being a laminate structure comprising:

an electrically conductive and patterned back plane having an aperture;

an electrically insulating layer formed on the back plane; and an electrically conductive layer formed on the insulating layer as a plurality of electrically conductive traces interconnecting said transducer and said electronics module, at least one of the traces extending across the aperture with the longitudinal axis of the trace forming an angle other than perpendicular with the periphery of the aperture.

2. The suspension according to claim 1 wherein one of the traces includes a narrowed portion having two ends, each end of the narrowed portion having a transition region, and the width of the transition region being a gradual variation from the width of the trace to the width of the narrowed portion.

3. The suspension according to claim 1 wherein
   one of the traces includes a bonding area having a width larger than the width of the trace for ease of electrical connection, the bonding area having a transition region, and the width of the transition region being a gradual variation from the width of the trace to the width of the bonding area.

4. The suspension according to claim 1 wherein
   one of the traces includes a turn in the plane of the conductive layer, the turn having an inner radius and a generally constant width, and the inner radius of the turn having a value greater than the generally constant width of the trace.

5. The suspension according to claim 1 further comprising a second transducer, each of the transducers having at least one read trace for reading data from the data surface and at least one write trace for writing data to the data surface, the read and write traces extending along the length of the suspension, wherein the read traces are grouped together and the write traces are grouped together, and wherein the group of the read traces is located away from the group of the write traces as far as the width of the suspension can accommodate.

6. The suspension according to claim 5 wherein the read and write traces have a bonding area at each end of the traces for electrical connection, the bonding areas for the read traces are grouped together and the bonding areas for the write traces are grouped together, and the group of the read trace bonding areas is located away from the group of the write trace bonding areas as far as the width of the suspension can accommodate.

7. The suspension according to claim 1 further comprising:

a base layer;

a second electrically insulating layer formed on the base layer; and wherein the back plane is formed on the second insulating layer.

8. The suspension according to claim 7 wherein the base layer is a first layer of dielectric material, and wherein the suspension further comprises a second layer of dielectric material deposited on the traces for protection of the traces.

9. The suspension according to claim 1 wherein the width of the trace is wider in the region above the aperture.

10. The suspension according to claim 9 wherein the wider region comprises a transition portion near each of its ends, the width of each transition portion being a gradual variation from the width of the trace to the width of the wider region.

11. The suspension according to claim 1 wherein the trace includes a lateral extension from a side edge of the trace and near the aperture to compensate for a decrease in the characteristic impedance of the trace in the region above the aperture when data is transferred between the transducer and the electronics module.

12. The suspension according to claim 1 wherein one of the traces includes a bonding area having a width larger than the width of the trace for ease of electrical connection, and the back plane is partially removed under the bonding area to compensate for a decrease in the characteristic impedance of the trace at the bonding area when data is transferred between the transducer and the electronics module.

13. The suspension according to claim 12 further comprising a trace-like portion of the back plane under the bonding area to compensate for a change in the characteristic impedance of the trace in the region near the bonding area, the trace-like portion having a width substantially the same as the width of the trace and extending from the rest of the back plane, directly below the trace and generally in the direction of the longitudinal axis of the trace.

14. The suspension according to claim 13 wherein the trace-like portion under the bonding area further comprises a transition region between the trace-like portion and the rest of the back plane, the width of the transition region in the area adjacent the rest of the back plane being wider than the width of the trace-like portion and gradually tapered into the width of the trace-like portion.

15. The suspension according to claim 1 wherein the electronics module has an output impedance, and wherein the characteristic impedance of one of the traces in the region near the electronics module end of the trace is substantially equal to the output impedance of the electronics module when data is transferred between the transducer and the electronics module.

16. The suspension according to claim 1 wherein the transducer has an output impedance, and wherein the characteristic impedance of one of the traces in the region near the transducer end of the trace is substantially equal to the output impedance of the transducer when data is transferred between the transducer and the electronics module.

17. The suspension according to claim 1 wherein the characteristic impedance of one of the traces in the region near the electronics module end of the trace is different from the characteristic impedance of the trace in the region near the transducer end of the trace when data is transferred between the transducer and the electronics module;

the width of the trace in the region near the electronics module end is different from that in the region near the transducer end; and wherein the trace includes a transition region between the end regions, the width of the transition region being a gradual variation between the width of the end regions.

18. A suspension for a data recording disk drive of the type having a disk with a data surface, a transducer for writing data to and reading data from the disk, the transducer having an output impedance and being attached to a slider maintained adjacent to the data surface of the disk, an actuator for moving the slider across the disk, and an electronics module having an impedance different from that of the transducer, the suspension being a laminate structure comprising:

a base layer; and an electrically conductive layer formed on the base layer as a plurality of electrically conductive traces interconnecting said transducer and said electronics module, each of said traces having a bonding area near each of its ends with a width larger than the width of the trace for electrical connection to the transducer and the electronics module, each bonding area having a transition region with a width being a gradual variation from the width of the trace near the bonding area to the width of the bonding area, whereby the characteristic impedance of the trace in the region near the electronics module end of the trace is substantially equal to the output impedance of the electronics module, and the characteristic impedance of the trace in the region near the transducer end of the trace is substantially equal to the output impedance of the transducer; and the width of the trace being gradually tapered between the transducer and module end regions, thereby avoiding any abrupt changes in the trace characteristic impedance along the length of the trace.

19. A transducer-slider-suspension-arm assembly for a data recording disk drive of the type having a rotatable disk with a data surface, an actuator for moving the transducer generally radially relative to the disk so as to read data from or write data to the data surface during rotation of the disk, and an electronics module for processing data read from and written to the data surface, the transducer-slider-suspension-arm assembly comprising:

a slider maintained in operative relationship with the data surface when the disk is rotating;

a transducer attached to the slider for reading data from and writing data to the data surface;

a laminate suspension having two ends, its first end attached to said slider, the laminate suspension comprising (a) an electrically conductive and patterned back plane having an aperture; (b) an electrically insulating layer formed on the back plane; and (c) an electrically conductive layer formed on the insulating layer as a plurality of electrically conductive traces interconnecting said transducer and said electronics module, at least one of the traces extending across the aperture with the longitudinal axis of the trace forming an angle other than perpendicular with the periphery of the aperture; and a generally rigid support arm having two ends, its first end attached to the second end of the suspension and its second end attached to the actuator.

20. A data recording disk drive comprising:

a disk with a data surface of concentric data tracks;

means attached to the disk for rotating the disk about an axis generally perpendicular to the disk;

a slider maintained in operative relationship with the data surface when the disk is rotating;

a transducer attached to the slider for reading data from and writing data to the data surface;

an actuator for moving the slider generally radially relative to the disk to allow the transducer to access the data tracks;

an electronics module for processing data read from and written to the data surface;

a laminate suspension having two ends, its first end attached to said slider, the laminate suspension comprising (a) an electrically conductive and patterned back plane having an aperture; (b) an electrically insulating layer formed on the back plane; and (c) an electrically conductive layer formed on the insulating layer as a plurality of electrically conductive traces interconnecting said transducer and said electronics module, at least one of the traces extending across the aperture with the longitudinal axis of the trace forming an angle other than perpendicular with the periphery of the aperture; and a generally rigid support arm having two ends, its first end attached to the second end of the suspension and its second end attached to the actuator.

* * * * *